United States Patent
Shih

(10) Patent No.: US 10,763,874 B2
(45) Date of Patent: Sep. 1, 2020

(54) SIGNAL PROCESSING SYSTEM AND METHOD THEREOF

(71) Applicant: NUVOTON TECHNOLOGY CORPORATION, Hsinchu (TW)

(72) Inventor: Cheng-Feng Shih, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/585,434

(22) Filed: Sep. 27, 2019

(65) Prior Publication Data
US 2020/0162089 A1 May 21, 2020

(30) Foreign Application Priority Data
Nov. 20, 2018 (TW) .............................. 107141229 A

(51) Int. Cl.
*H03M 1/08* (2006.01)
*H03M 1/06* (2006.01)
*H03M 1/12* (2006.01)

(52) U.S. Cl.
CPC ........... *H03M 1/08* (2013.01); *H03M 1/0626* (2013.01); *H03M 1/12* (2013.01)

(58) Field of Classification Search
CPC ......... H03M 1/08; H03M 1/12; H03M 1/0626
USPC .......................... 341/140–160; 375/229, 285
See application file for complete search history.

(56) References Cited

U.S. PATENT DOCUMENTS

| 6,104,682 | A * | 8/2000 | Konishi | G11B 7/08505 369/124.01 |
| 9,924,268 | B1 * | 3/2018 | Tsao | H04R 3/007 |
| 10,009,700 | B1 * | 6/2018 | Pan | H04R 29/001 |
| 10,250,996 | B1 * | 4/2019 | Holzmann | H04R 19/016 |
| 2005/0220066 | A1 * | 10/2005 | Wal | H04L 25/063 370/343 |
| 2011/0051014 | A1 * | 3/2011 | Wang | H03J 3/20 348/731 |
| 2011/0135103 | A1 * | 6/2011 | Sun | H04R 29/00 381/58 |
| 2013/0147759 | A1 * | 6/2013 | Chang | G06F 3/0416 345/174 |
| 2017/0041011 | A1 * | 2/2017 | Venkatraman | H03M 1/0626 |
| 2017/0328932 | A1 * | 11/2017 | Hickman | H03M 1/12 |

(Continued)

*Primary Examiner* — Lam T Mai
(74) *Attorney, Agent, or Firm* — Muncy, Geissler, Olds & Lowe, P.C.

(57) ABSTRACT

A signal processing system includes an adjustable filter, a signal difference calculating unit, a determining unit and a selecting unit. The adjustable filter is configured to receive a digital signal outputted from an analog-to-digital converter, and filter the digital signal to generate a filtered signal. The signal difference calculating unit is configured to calculate and output a signal difference value between the digital signal and the filtered signal. The determining unit is configured to compare the signal difference value with a predetermined threshold value, to generate a comparison result, and generate a selection signal and a bandwidth adjustment signal according to the comparison result. The selecting unit is configured to receive the digital signal and the filtered signal, and output one of the digital signal and the filtered signal according to the selection signal. The bandwidth of the adjustable filter can be adjusted according to the bandwidth adjustment signal.

10 Claims, 8 Drawing Sheets

(56) References Cited

U.S. PATENT DOCUMENTS

2018/0183454 A1* 6/2018 Lee .................. H03M 1/145
2019/0069074 A1* 2/2019 Yamkovoy ........... G10K 11/178

* cited by examiner

SIGNAL PROCESSING SYSTEM AND METHOD THEREOF

CROSS-REFERENCE TO RELATED APPLICATION

This application claims the benefit of Taiwan Patent Application No. 107141229, filed on Nov. 20, 2018, in the Taiwan Intellectual Property Office, the disclosure of which is incorporated herein in its entirety by reference.

BACKGROUND OF THE INVENTION

1. Field of the Invention

The present invention relates to a signal processing system, more particularly to a signal processing system which is able to improve a signal-to-noise ratio of an analog-to-digital converter, and a method thereof.

2. Description of the Related Art

Analog-to-digital converters (ADCs) are used to convert analog signals into digital signals. In practical applications, the analog signals possibly contain data signals and environmental noise. During conversion process, the analog-to-digital converter also generates quantization noise and circuit noise. As a result, the converted digital signal is affected by environmental noise, quantization noise, and circuit noise.

In general, the signal-to-noise ratio (SNR) defined in the specification of an analog-to-digital converter is for the ratio of data signal to quantization noise and circuit noise. In order to improve the signal-to-noise ratio, a filter can be built in the analog-to-digital converter and the bandwidth of the built-in filter must cover the sampling frequency of the analog-to-digital converter, otherwise the performance of the analog-to-digital converter is affected by the built-in filter. As a result, when the frequency of the signal is low, the built-in filter still cannot effectively improve the signal-to-noise ratio.

For the above reasons, in practical applications, the digital signal output by the analog digital converter needs to be processed by software to eliminate environmental noise.

SUMMARY OF THE INVENTION

In order to solve the above-mentioned problem, the present invention provides signal processing system and a method thereof, to effectively improve the signal-to-noise ratio of an analog-to-digital converter.

According to an embodiment, the present invention provides a signal processing system adapted to an analog-to-digital converter and comprising an adjustable filter, a signal difference calculating unit, a determining unit and a selecting unit. The adjustable filter is configured to receive a digital signal outputted from the analog-to-digital converter, and filter the digital signal to generate a filtered signal. The signal difference calculating unit is configured to calculate and output a signal difference value between the digital signal and the filtered signal. The determining unit is configured to compare the signal difference value with a preset threshold value to generate the comparison result, and generate a selection signal and a bandwidth adjustment signal according to the comparison result. The selecting unit is configured to receive the digital signal and the filtered signal, and output one of the digital signal and the filtered signal according to the selection signal. A bandwidth of the adjustable filter is adjusted according to the bandwidth adjustment signal.

Preferably, the adjustable filter is an adjustable low-pass filter.

Preferably, when the signal difference value is higher than the preset threshold value, the selecting unit outputs the digital signal according to the selection signal, and the adjustable filter extends the bandwidth thereof according to the bandwidth adjustment signal, and when the signal difference value is lower than the preset threshold value, the selecting unit outputs the filtered signal according to the selection signal, and the adjustable filter narrows the bandwidth thereof according to the bandwidth adjustment signal.

Preferably, the preset threshold value comprises a first threshold value and a second threshold value, the determining unit compares the signal difference value with the first threshold value and the second threshold value, respectively, to generate a comparison result and generates a selection signal and the bandwidth adjustment signal according to the comparison result; and the first threshold value is higher than the second threshold value; when the signal difference value is higher than the first threshold value, the selecting unit outputs the digital signal according to the selection signal, and the adjustable filter extends the bandwidth thereof according to the bandwidth adjustment signal, and when the signal difference value is lower than the first threshold value and higher than the second threshold value, the selecting unit outputs the filtered signal according to the selection signal, and the adjustable filter narrows the bandwidth thereof according to the bandwidth adjustment signal, and when the signal difference value is lower than the second threshold value, the selecting unit outputs the filtered signal according to the selection signal, and the adjustable filter keeps the bandwidth thereof.

Preferably, the adjustable filter comprises a first adjustable filter and a second adjustable filter configured to filter the digital signal to generate a first filtered signal and a second filtered signal, respectively, and a bandwidth of the first adjustable filter is broader than a bandwidth of the second adjustable filter; the signal difference calculating unit calculates and outputs a first signal difference value and a second signal difference value between the digital signal and the first filtered signal and the second filtered signal, respectively, and the determining unit compares the first signal difference value and the second signal difference value with a preset threshold value to generate the comparison result, and generate the selection signal, a first bandwidth adjustment signal and a second bandwidth adjustment signal according to the comparison result.

Preferably, when the first signal difference value and the second signal difference value are higher than the preset threshold value, the selecting unit outputs the digital signal according to the selection signal, and the first adjustable filter extends the bandwidth according to the first bandwidth adjustment signal; when the first signal difference value is lower than the preset threshold value and the second signal difference value is higher than the preset threshold value, the selecting unit outputs the first filtered signal according to the selection signal, and the first adjustable filter narrows the bandwidth according to the first bandwidth adjustment signal, and the second adjustable filter extends the bandwidth according to the second bandwidth adjustment signal; when both of the first signal difference value and the second signal difference value are lower than the preset threshold value, the selecting unit outputs the second filtered signal according to the selection signal, and the second adjustable filter narrows the bandwidth thereof according to the second bandwidth adjustment signal.

Preferably, the preset threshold value comprises a first threshold value and a second threshold value, the determining unit compares the first signal difference value and the second signal difference value with the first threshold value and the second threshold value, and the first threshold value is higher than the second threshold value; when both of the first signal difference value and the second signal difference value are higher than the first threshold value, the selecting unit outputs the digital signal according to the selection signal, and the first adjustable filter extends the bandwidth thereof according to the first bandwidth adjustment signal; when both of the first signal difference value and the second signal difference value are lower than the first threshold value, the selecting unit outputs the second filtered signal according to the selection signal, and the second adjustable filter narrows the bandwidth thereof according to the second bandwidth adjustment signal; when the first signal difference value is lower than the first threshold value and higher than the second threshold value and the second signal difference value is higher than the first threshold value, the selecting unit outputs the first filtered signal according to the selection signal, and the first adjustable filter narrows the bandwidth thereof according to the first bandwidth adjustment signal, and the second adjustable filter extends the bandwidth thereof according to the second bandwidth adjustment signal; when the first signal difference value is lower than the second threshold value, the selecting units output the first filtered signal according to the selection signal, and the first adjustable filter keeps the bandwidth thereof; when the second signal difference value is lower than the second threshold value, the selecting unit outputs the second filtered signal according to the selection signal, and the second adjustable filter keeps the bandwidth thereof.

According to an embodiment, the present invention provides a signal processing method adapted to an analog-to-digital converter outputting a digital signal. The signal processing method comprises steps of using an adjustable filter to filter the digital signal, to generate a filtered signal; calculating and outputting a signal difference value between the digital signal and the filtered signal; comparing the signal difference value with a preset threshold value, to generate the comparison result, and then generating a selection signal and a bandwidth adjustment signal according to the comparison result; according to the selection signal, outputting one of the digital signal and the filtered signal; and adjusting a bandwidth of the adjustable filter according to the bandwidth adjustment signal.

According to an embodiment, the present invention provides a signal processing system adapted to an analog-to-digital converter, and comprising a plurality of filters, a signal difference calculating unit, a determining unit and a selecting unit. The plurality of filters are configured to receive a digital signal outputted from the analog-to-digital converter, and filter the digital signal to generate a plurality of filtered signals. The plurality of filters have different bandwidths. The signal difference calculating unit is configured to calculate and output a plurality of signal difference values between the digital signal and the plurality of filtered signals, and output a minimal signal difference value among the plurality of signal difference values, and output the filtered signal corresponding to the minimal signal difference value. The determining unit is configured to compare the minimal signal difference value with the preset threshold value to generate the comparison result, and then generate a selection signal according to the comparison result. The selecting unit is configured to receive the digital signal and the filtered signal corresponding to the minimal signal difference value, and output one of the digital signal and the filtered signal corresponding to the minimal signal difference value, according to the selection signal.

According to an embodiment, the present invention provides a signal processing system adapted to an analog-to-digital converter and comprising a plurality of filters, a signal difference calculating unit, a determining unit and a selecting unit. The plurality of filters are configured to receive a digital signal outputted from the analog-to-digital converter, and filter the digital signal to generate a plurality of filtered signals. The plurality of filters have different bandwidths. The signal difference calculating unit are configured to calculate and output a plurality of signal difference values between the digital signal and the plurality of filtered signals, and output a minimal signal difference value among the plurality of signal difference values, and a filter ID code corresponding to the minimal signal difference value. The determining unit is configured to compare the minimal signal difference value with the preset threshold value to generate a comparison result, and then generate a selection signal according to the comparison result and the filter ID code. The selecting unit is configured to receive the digital signal and the filtered signal, and output one of the digital signal and the plurality of filtered signals according to the selection signal.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
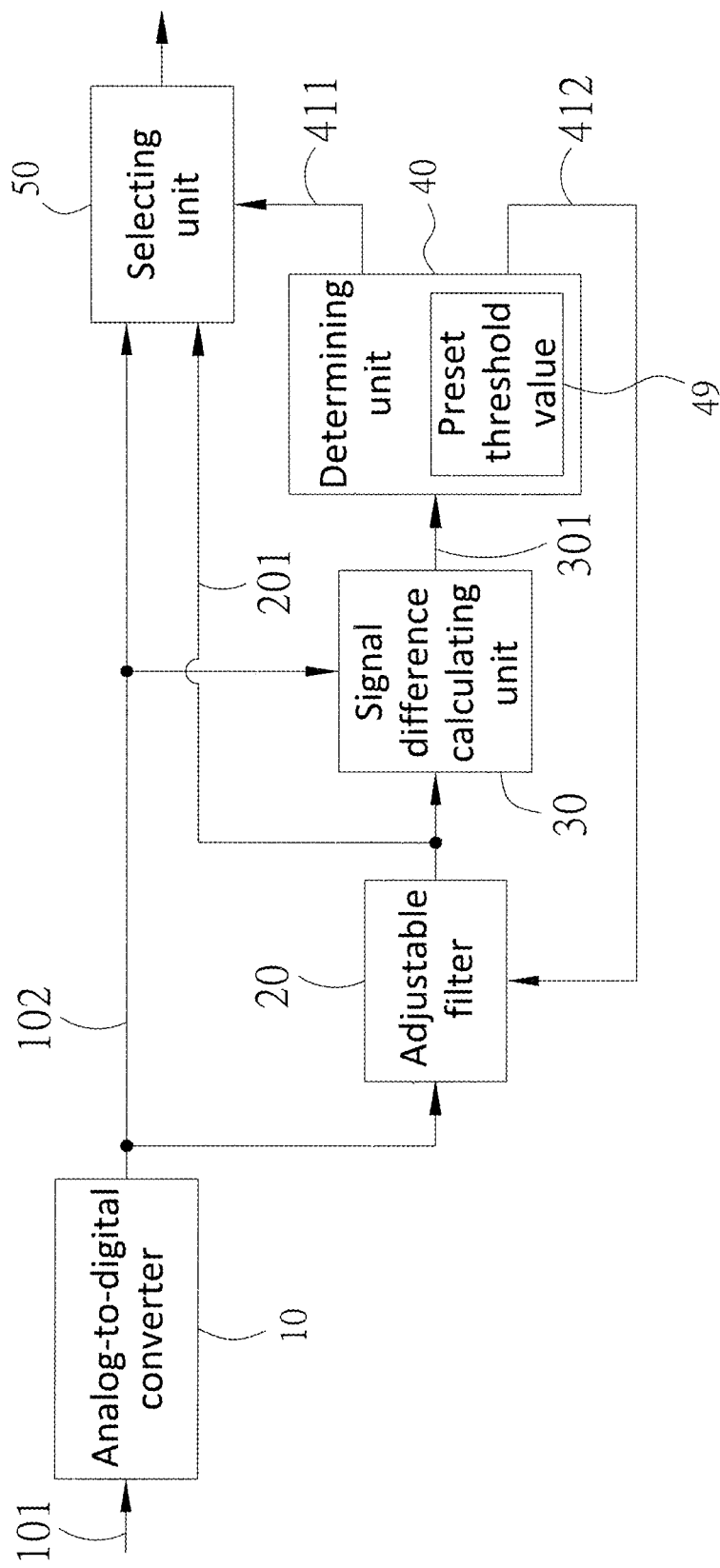
FIG. 1 is a block diagram of an embodiment of a signal processing system of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Please refer to FIG. 1, which is a block diagram of an embodiment of a signal processing system of the present invention. As shown in FIG. 1, the signal processing system of the present invention is applicable to an analog-to-digital converter 10, and the signal processing system can comprise an adjustable filter 20, a signal difference calculating unit 30, a determining unit 40, and a selecting unit 50. The analog-to-digital converter 10 can receive an analog signal 101, and convert the analog signal 101 into a digital signal 102.

The adjustable filter 20 is configured to receive the digital signal 102 outputted from the analog-to-digital converter 10, and filter the received digital signal 102, so as to generate a filtered signal 201. Preferably, the adjustable filter 20 can be an adjustable low-pass filter which can be a low-pass filter with a bandwidth adjusted by an external control signal.

The signal difference calculating unit 30 is configured to calculate and output a signal difference value 301 between the digital signal 102 and the filtered signal 201. In an actual application, the digital signal 102 can comprise a plurality of bits, and the number of bit of the filtered signal 201 is the same as that of the digital signal 102, and the signal difference value 301 can comprise at least one bit, for example, the signal difference value 301 can be a least significant bit (LSB) where the bit of the digital signal 102 is different from that of the filtered signal 201, or the number of the least significant bit.

For example, when a resolution of the analog-to-digital converter 10 is 10, it indicates that the number of bits of the digital signal 102 is ten, for example, the digital signal 102 can be "1101100111" and filtered signal 201 can be "1101001010", the least significant bits indicative of difference between the digital signal 102 and the filtered signal 201 is are "100111", so the signal difference value 301 can be "100111" or six, and it indicates that the filtering process performed by the adjustable filter 20 affects the sixth bit of the digital signal 102.

The determining unit 40 is configured to compare the signal difference value 301 and a preset threshold value 49 to generate a comparison result, and also generate a selection signal 411 and a bandwidth adjustment signal 412 according to the comparison result. The selecting unit 50 is configured to receive the digital signal 102 and the filtered signal 201, and output one of the digital signal 102 and the filtered signal 201 according to the selection signal 411.

The bandwidth of the adjustable filter 20 can be adjusted according to the bandwidth adjustment signal 412. When the signal difference value 301 is higher than the preset threshold value 49, it indicates that the adjustable filter 20 filters out the data signal of the digital signal 102, so the selecting unit 50 can output the digital signal 102 according to the selection signal 411, and the adjustable filter 20 can extend the bandwidth thereof according to the bandwidth adjustment signal 412, thereby preventing filtering out the data signal of the digital signal 102.

When the signal difference value 301 is lower than the preset threshold value 49, it indicates that the adjustable filter 20 filters out the noise of the digital signal 102 only, so the selecting unit 50 can output the filtered signal 201 according to the selection signal 411, and the adjustable filter 20 can narrow the bandwidth thereof according to the bandwidth adjustment signal 412, thereby filtering out more noise. Preferably, the selecting unit 50 can be implemented by a multiplexer.

In an actual application, the analog signal 101 possibly include the data signal and the environmental noise, and during the data conversion the analog-to-digital converter 10 generates the quantization noise and the circuit noise, so the digital signal 102 is possibly affected by environmental noise, quantization noise, and circuit noise.

In an embodiment, when the adjustable filter 20 can filter the digital signal 102; particularly, when the frequency of the data signal is lower than the frequency of the environmental noise, the adjustable filter 20 can be implemented by a low-pass filter, to filter out the high-frequency environmental noise. Furthermore, since the determining unit 40 can adjust the bandwidth of the adjustable filter 20 by a feedback scheme, when the frequency of the data signal changes, the bandwidth of the adjustable filter 20 can be adjusted adaptively, for example, the bandwidth can be extended to prevent the data signal from being filtered out; or, the bandwidth can be narrowed to filter out more environmental noise effectively.

Figure 2:
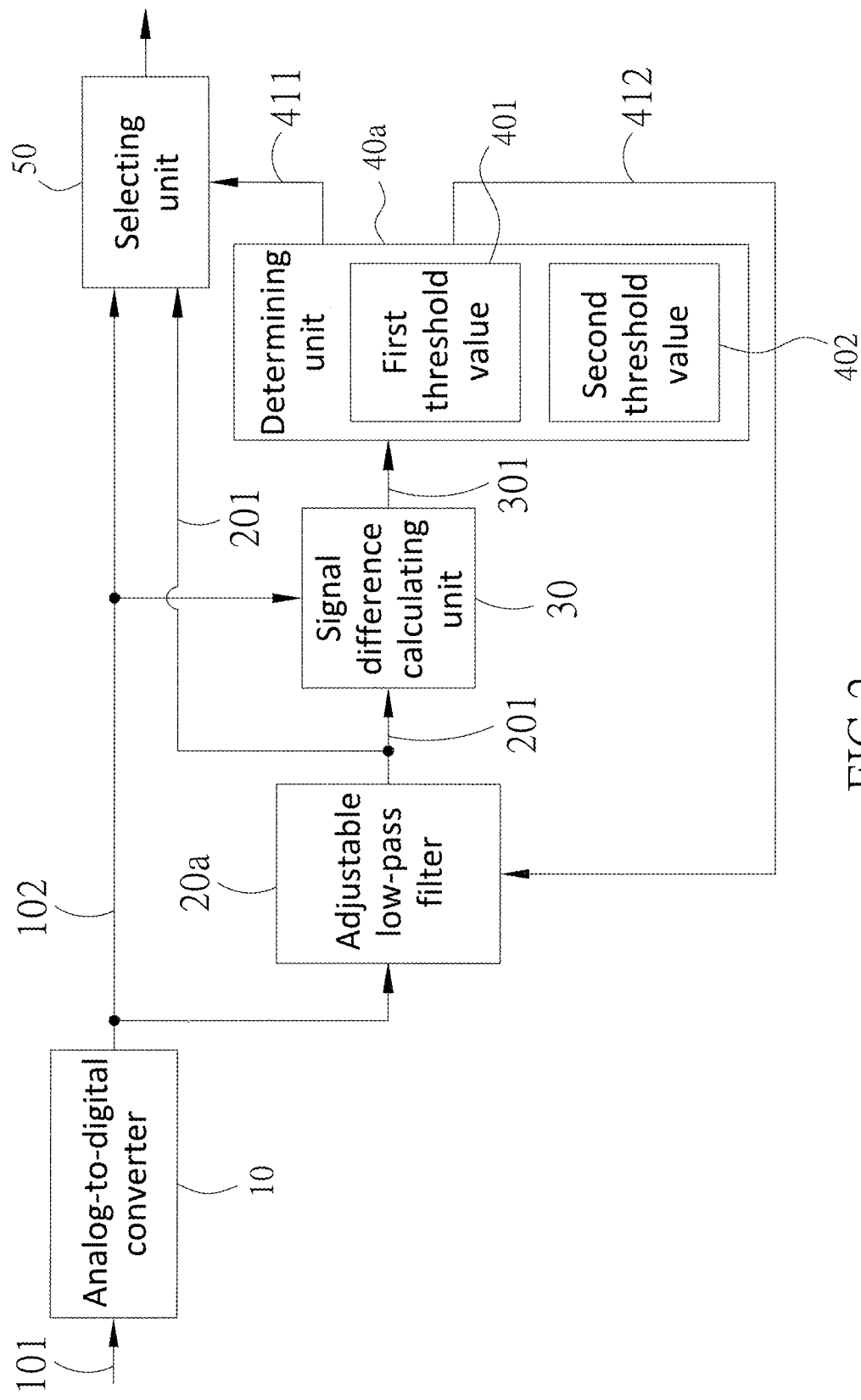
FIG. 2 is a block diagram of another embodiment of a signal processing system of the present invention.

Please refer to FIG. 2, which is a block diagram of another embodiment of a signal processing system of the present invention. As shown in FIG. 2, the signal processing system can be adapted to the analog-to-digital converter 10, and the signal processing system can comprise an adjustable low-pass filter 20a, a signal difference calculating unit 30, a determining unit 40a and a selecting unit 50. The analog-to-digital converter 10 can receive an analog signal 101, and convert the received analog signal 101 into the digital signal 102. The difference between the embodiment shown in FIG. 2 and the aforementioned embodiment is that the embodiment shown in FIG. 2 includes the adjustable low-pass filter 20a, and the determining unit 40a using two threshold values.

In the embodiment, when the threshold values used in the determining unit 40a comprise a first threshold value 401 and a second threshold value 402, and the first threshold value 401 is higher than the second threshold value 402. The determining unit 40a compares the signal difference value 301 with the first threshold value 401 and the second threshold value 402, to generate a comparison result. The determining unit 40*a* can generate the selection signal 411 and the bandwidth adjustment signal 412 according to the comparison result.

When the signal difference value 301 is higher than the first threshold value 401, it indicates that the adjustable low-pass filter 20*a* filters out the data signal of the digital signal 102, so the selecting unit 50 can output the digital signal 102 according to the selection signal 411, and the adjustable filter 20 can extend the bandwidth according to the bandwidth adjustment signal 412.

When the signal difference value 301 is lower than the first threshold value 401 and higher than the second threshold value 402, it indicates that the adjustable low-pass filter 20*a* does not filter out the data signal of the digital signal 102 and there is much room to filter out the environmental noise, so the noise contained in the filtered signal 201 is less than that of the digital signal, and the selecting unit 50 can output the filtered signal 201 according to the selection signal 411, thereby increasing the signal-to-noise ratio of the analog-to-digital converter 10. Next, the adjustable low-pass filter 20*a* can narrow the bandwidth thereof according to the bandwidth adjustment signal 412, so as to filter out more environmental noise.

When the signal difference value 301 is lower than the second threshold value 402, it indicates that the environmental noise of the digital signal 102 is filtered out effectively, so the selecting unit 50 can output the filtered signal 201 according to the selection signal 411, thereby increasing the signal-to-noise ratio of the analog-to-digital converter 10. Next, the adjustable low-pass filter 20*a* can keep the bandwidth thereof.

For example, when a resolution of the analog-to-digital converter 10 is 10, it indicates that the number of bits of the digital signal 102 is ten, and the first threshold value 401 can be 5-bit data or five, and the second threshold value 402 can be 3-bit data or three, and the initial bandwidth of the adjustable low-pass filter 20*a* is from 0 Hz to 6 KHz and can be adjusted to 10 KHz. For example, the digital signal 102 can be "1101100111", and the filtered signal 201 can be "1101001010", the least significant bits indicative of the difference between the digital signal 102 and the filtered signal 201 are "100111" which is 6-bit and higher than the first threshold value 401, so the selecting unit 50 can output the digital signal 102, and the adjustable low-pass filter 20*a* extends the bandwidth thereof to 6 KHz. When the filtered signal 201 is "1101101010", and the signal difference value 301 is "0111" which is 4-bit and lower than first threshold value 401 and higher than the second threshold value 402, the selecting unit 50 can output the filtered signal 201, and the adjustable low-pass filter 20*a* narrows the bandwidth thereof to 4 K Hz; when the filtered signal 201 is "1101100100" and the signal difference value 301 is "11" which is 2-bit and lower than the second threshold value 402, the selecting unit 50 can output the filtered signal 201, and the adjustable low-pass filter 20*a* can keep the bandwidth thereof.

Figure 3:
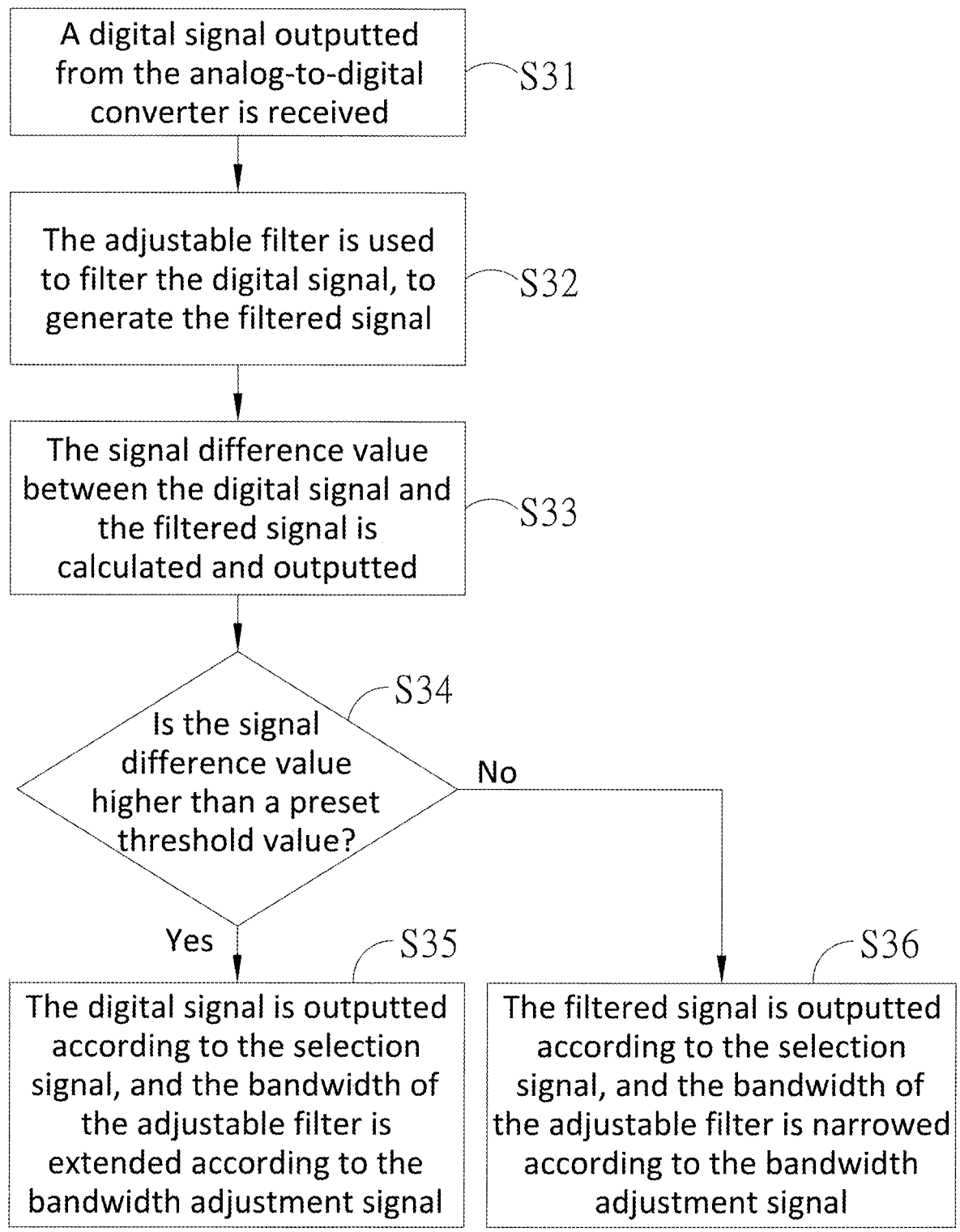
FIG. 3 is a flowchart showing the steps in an operation of an embodiment of a signal processing method of the present invention.

Please refer to FIG. 3, which is a flowchart showing the steps in an operation of an embodiment of a signal processing method of the present invention. As shown in FIG.3, the signal processing method can be adapted to the analog-to-digital converter, and include steps S31 to S36. In a step S31, a digital signal outputted from the analog-to-digital converter is received. In a step S32, the adjustable filter is used to filter the digital signal, to generate the filtered signal. In a step S33, the signal difference value between the digital signal and the filtered signal is calculated and outputted. In a step S34, the signal difference value is compared with the preset threshold value, to generate the comparison result, and the selection signal and the bandwidth adjustment signal are generated according to the comparison result. When the signal difference value is higher than the preset threshold value, the flow enters a step S35, and when the signal difference value is lower than the preset threshold value, the flow enters a step S36.

In a step S35, the digital signal is outputted according to the selection signal, and the bandwidth of the adjustable filter is extended according to the bandwidth adjustment signal.

In a step S36, the filtered signal is outputted according to the selection signal, and the bandwidth of the adjustable filter is narrowed according to the bandwidth adjustment signal.

Figure 4:
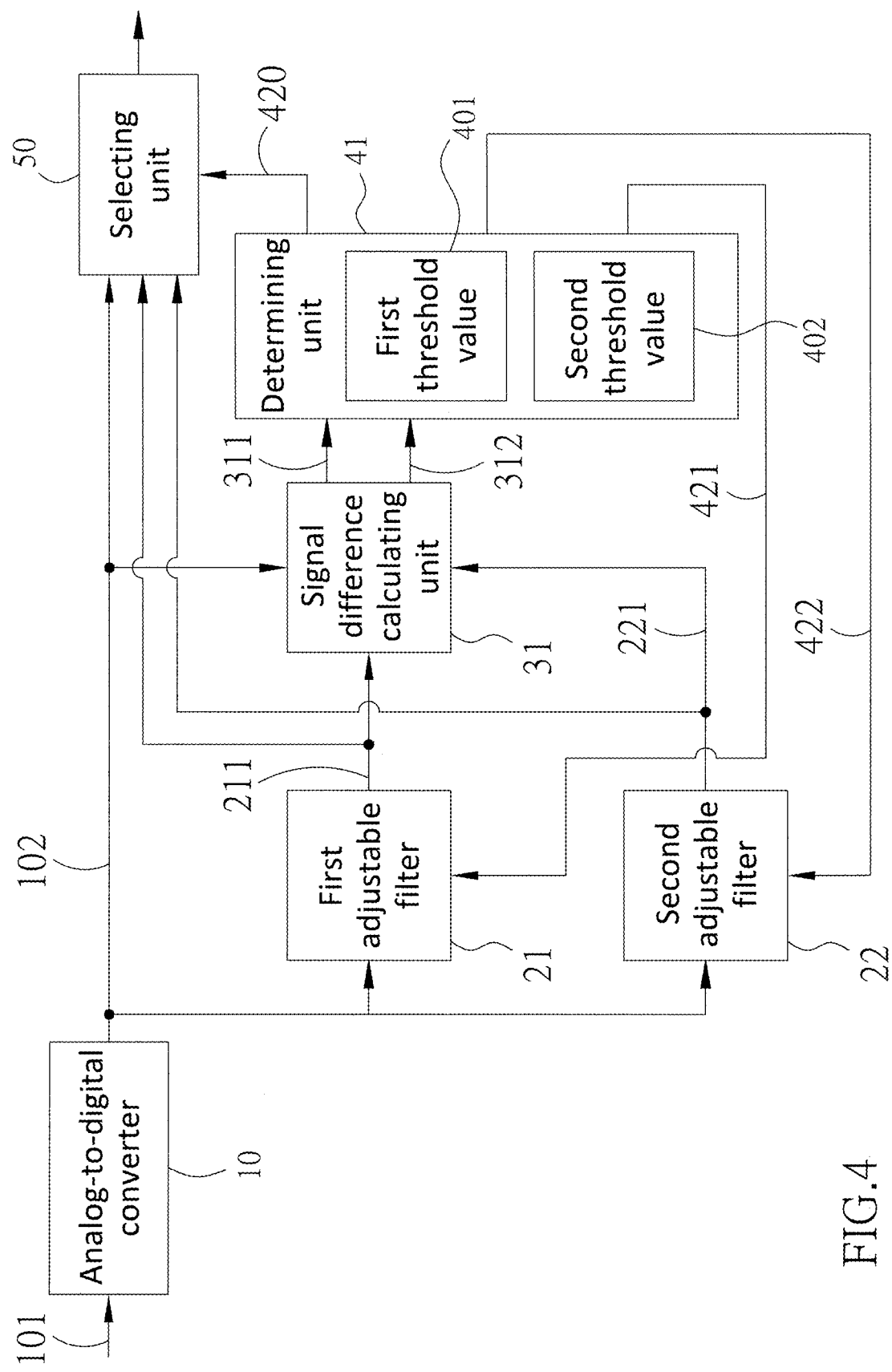
FIG. 4 is a block diagram of another embodiment of a signal processing system of the present invention.
Figure 5:
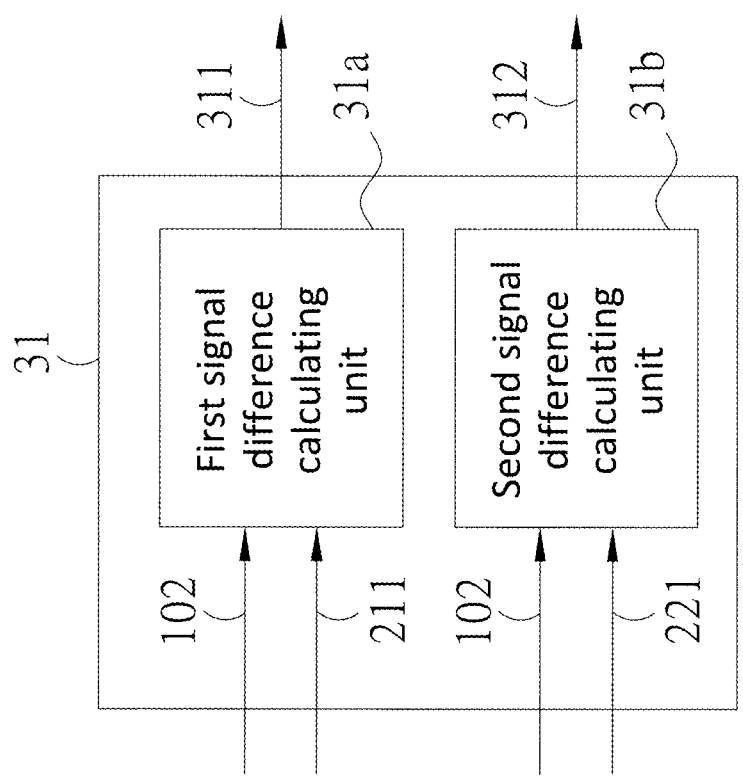
FIG. 5 is a block diagram of an embodiment of a signal difference calculating unit of a signal processing system of the present invention.

Please refer to FIGS. 4 and 5, which are a block diagram of another embodiment of a signal processing system of the present invention, and a block diagram of an embodiment of a signal difference calculating unit of a signal processing system of the present invention. As shown in FIG. 4, the signal processing system can comprise a first adjustable filter 21, a second adjustable filter 22, a signal difference calculating unit 31, a determining unit 41 and a selecting unit 50. The first adjustable filter 21 and the second adjustable filter 22 can filter the digital signal 102 to generate the first filtered signal 211 and the second filtered signal 221, respectively. In the embodiment, the bandwidth of the first adjustable filter 21 is higher than the bandwidth of the second adjustable filter 22.

The signal difference calculating unit 31 can calculate and output a first signal difference value 311 between the digital signal 102 and the first filtered signal 211, and a second signal difference value 312 between the digital signal 102 and the second filtered signal 221. As shown in FIG. 5, the signal difference calculating unit 31 can comprise a first signal difference calculating unit 31*a* and a second signal difference calculating unit 31*b*. The first signal difference calculating unit 31*a* is configured to compare the digital signal 102 with the first filtered signal 211 to find the different bits between the digital signal 102 and the first filtered signal 211, so as to generate a first signal difference value 311. The second signal difference calculating unit 3l*b* is configured to compare the digital signal 102 with the second filtered signal 221 to find the different bits between the digital signal 102 and the second filtered signal 221, so as to generate a second signal difference value 312.

The determining unit 41 can compare the first signal difference value 311 and the second signal difference value 312 with a preset threshold value, to generate a comparison result, and then generate a selection signal 420, a first bandwidth adjustment signal 421 and a second bandwidth adjustment signal 422 according to the comparison result.

In an embodiment, the number of the preset threshold value is one. When both of the first signal difference value 311 and the second signal difference value 312 are higher than the preset threshold value, the selecting unit 50 can output the digital signal 102 according to the selection signal 420, and the first adjustable filter 21 can extend the bandwidth thereof according to the bandwidth adjustment signal 412.

When the first signal difference value 311 is lower than the preset threshold value and the second signal difference value 312 is higher than the preset threshold value, the selecting unit 50 can output the first filtered signal 211 according to the selection signal 411, and the first adjustable filter 21 can narrow the bandwidth thereof according to the bandwidth adjustment signal 412, and the second adjustable filter 22 can extend the bandwidth thereof according to the bandwidth adjustment signal 412.

When both of the first signal difference value 311 and the second signal difference value 312 is lower than the preset threshold value 49, when the selecting unit 50 output the second filtered signal 221 according to the selection signal 411, and when the second adjustable filter 22 can narrow the bandwidth thereof according to the bandwidth adjustment signal 412.

In another embodiment, the number of the preset threshold values is multiple. For example, the preset threshold values can include a first threshold value 401 and a second threshold value 402, and the first threshold value 401 is higher than the second threshold value 402. The determining unit 41 can compare the first signal difference value 311 and the second signal difference value 312 with the first threshold value 401 and the second threshold value 402 to generate the comparison result, and then generate the selection signal 420, the first bandwidth adjustment signal 421 and the second bandwidth adjustment signal 422 according to the comparison result.

When the first signal difference value 311 is higher than the first threshold value 401, the selecting unit 50 can output the digital signal 102 according to the selection signal 420, and the first adjustable filter 21 can extend the bandwidth thereof according to the first bandwidth adjustment signal 421. When the second signal difference value 312 is lower than the first threshold value 401, the selecting unit 50 can output the second filtered signal 221 according to the selection signal 420, and the second adjustable filter 22 can narrow the bandwidth thereof according to the second bandwidth adjustment signal 422.

When the first signal difference value 311 is lower than the second threshold value 402, the selecting unit 50 can output the first filtered signal 211 according to the selection signal 420, and the first adjustable filter 21 keeps the bandwidth thereof. When the second signal difference value 312 is lower than the second threshold value 402, the selecting unit 50 can output the second filtered signal 221 according to the selection signal 420, and the second adjustable filter 22 can keep the bandwidth thereof.

When the first signal difference value 311 is lower than the first threshold value 401, and is higher than the second threshold value 402, the selecting unit 50 can output the first filtered signal 211 according to the selection signal 420, and the first adjustable filter 21 can narrow the bandwidth thereof according to the first bandwidth adjustment signal 421, and the second adjustable filter 22 can narrow the bandwidth thereof according to the second bandwidth adjustment signal 422.

Figure 6:
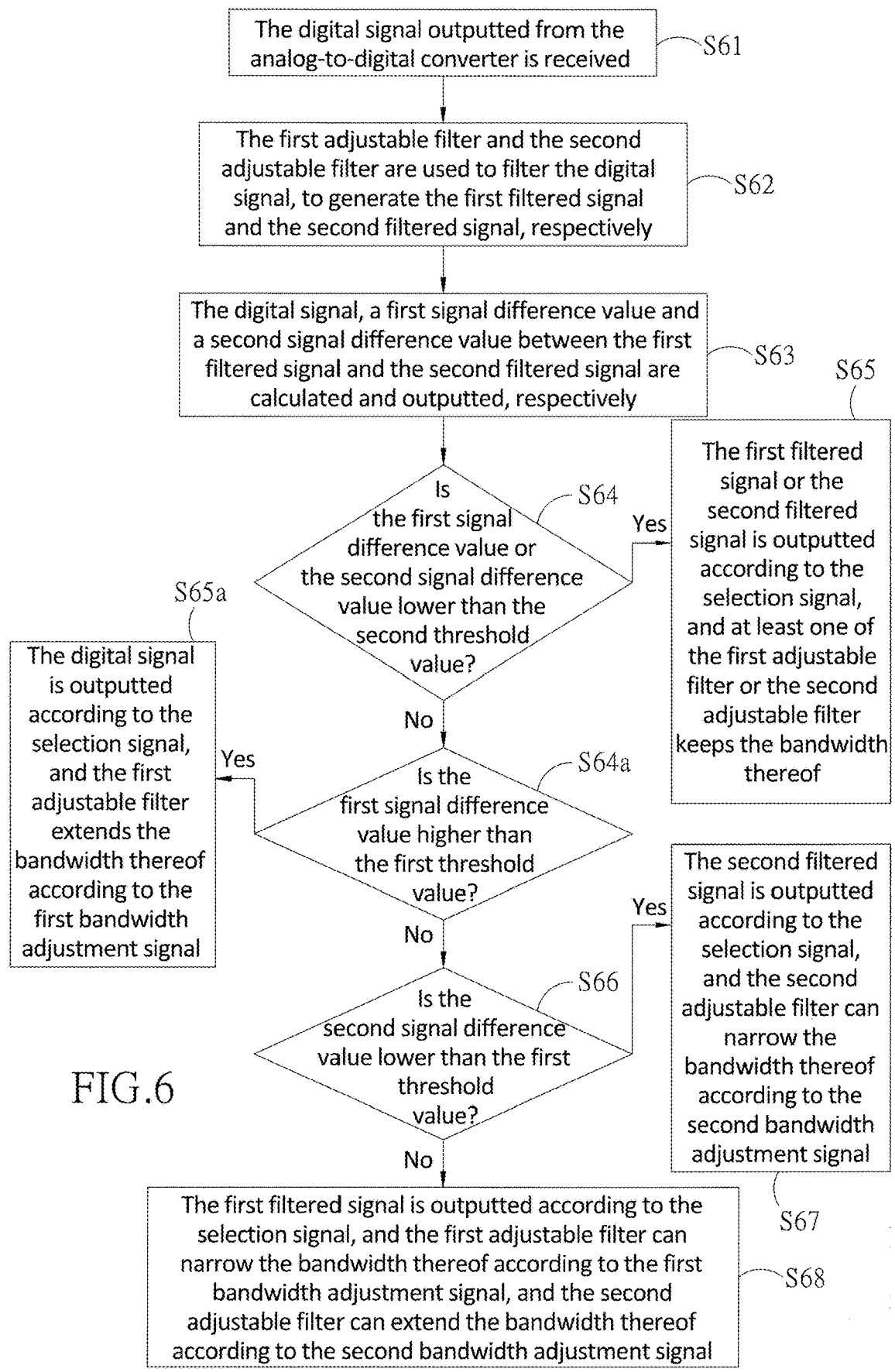
FIG. 6 is a flowchart showing the steps in an operation of another embodiment of a signal processing method of the present invention.

Please refer to FIG. 6, which is a flowchart showing the steps in an operation of another embodiment of a signal processing method of the present invention. As shown in FIG. 6, the signal processing method is adapted to the analog-to-digital converter and comprise steps S61 to S66. In a step S61, the digital signal outputted from the analog-to-digital converter is received. In a step S62, the first adjustable filter and the second adjustable filter are used to filter the digital signal, to generate the first filtered signal and the second filtered signal, respectively.

In a step S63, the digital signal, a first signal difference value and a second signal difference value between the first filtered signal and the second filtered signal are calculated and outputted, respectively, the first signal difference value and second signal difference value are then compared with a first threshold value and a second threshold value, respectively, to generate the comparison result, and the selection signal, the first bandwidth adjustment signal and the second bandwidth adjustment signal are then generated according to the comparison result. The first threshold value is higher than the second threshold value.

In a step S64, it is determined whether the first signal difference value or the second signal difference value is lower than the second threshold value, and when at least one of the first signal difference value and the second signal difference value is lower than the second threshold value, the flow enters a step S65; otherwise, the flow enters a step S64a. In a step S65, the first filtered signal or the second filtered signal is outputted according to the selection signal, and at least one of the first adjustable filter or the second adjustable filter keeps the bandwidth thereof.

In step S64a, it is determined whether the first signal difference value is higher than the first threshold value, and when the first signal difference value is higher than the first threshold value, the flow enters a step S65a; otherwise, the flow enters a step 66. In the step S65a, the digital signal is outputted according to the selection signal, and the first adjustable filter extends the bandwidth thereof according to the first bandwidth adjustment signal.

In a step S66, it is determined whether the second signal difference value is lower than the first threshold value, and when the second signal difference value is lower than the first threshold value, the flow enters a step S67; otherwise, the flow enters a step S68. In the step S67, the second filtered signal is outputted according to the selection signal, and the second adjustable filter can narrow the bandwidth thereof according to the second bandwidth adjustment signal. In the step S68, the first filtered signal is outputted according to the selection signal, and the first adjustable filter can narrow the bandwidth thereof according to the first bandwidth adjustment signal, and the second adjustable filter can extend the bandwidth thereof according to the second bandwidth adjustment signal.

Figure 7:
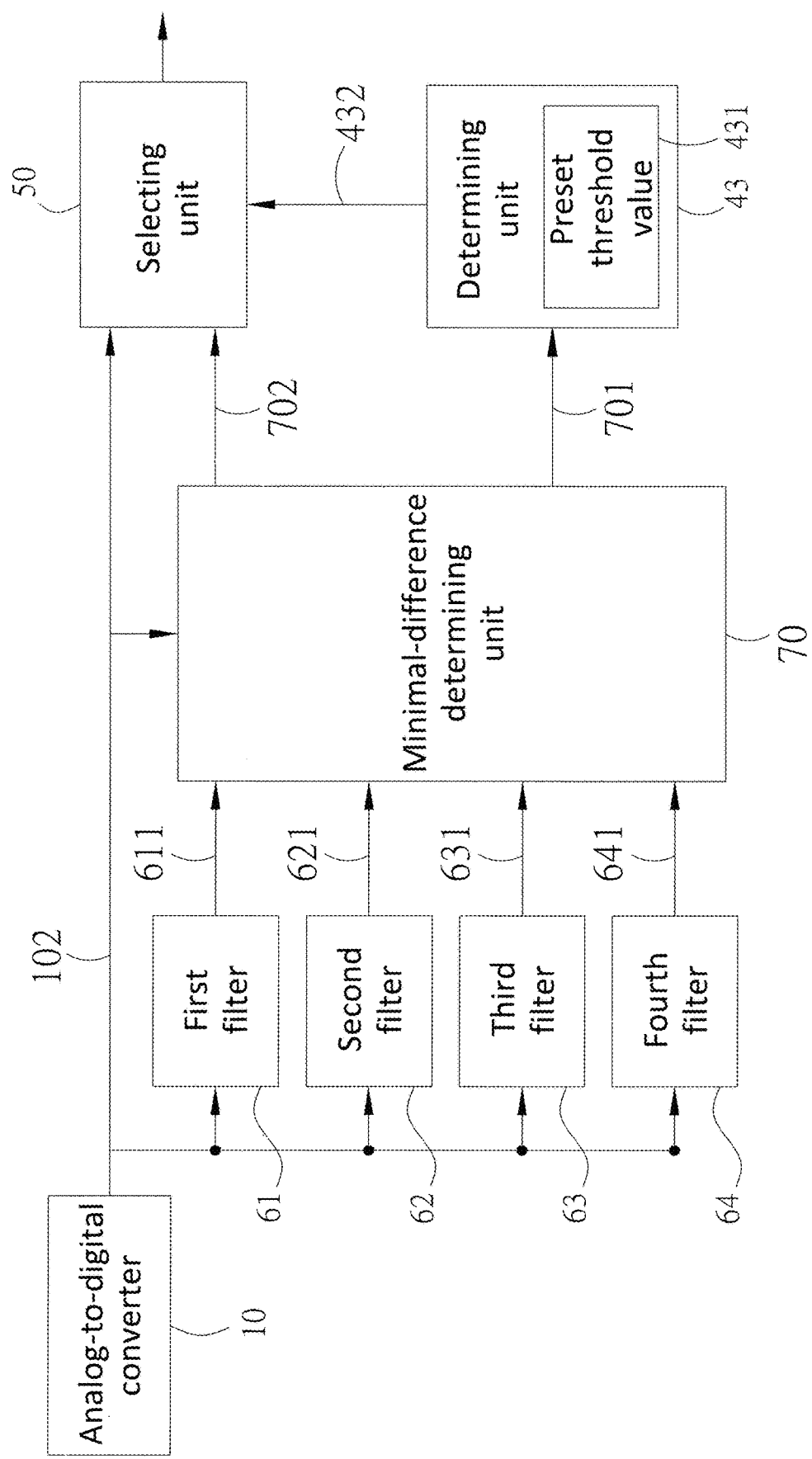
FIG. 7 is a block diagram of another embodiment of a signal processing system of the present invention.

Please refer to FIG. 7, which is a block diagram of another embodiment of a signal processing system of the present invention. As shown in FIG. 7, the signal processing system can be adapted to the analog-to-digital converter, and comprise a first filter 61, a second filter 62, a third filter 63, a fourth filter 64, a minimal-difference determining unit 70, a determining unit 43 and a selecting unit 50. The first filter 61, the second filter 62, the third filter 63, the fourth filter 64 have different bandwidths, for example, the bandwidth of the first filter 61 is from 0 Hz to 5 K Hz, the bandwidth of the second filter 62 is from 0 Hz to 6 K Hz, the bandwidth of the third filter 63 is 0 Hz to 7 K Hz, and the bandwidth of the fourth filter 64 is from 0 Hz to 8 KHz. The first filter 61, the second filter 62, the third filter 63, the fourth filter 64 are configured to receive the digital signal 102 outputted from the analog-to-digital converter 10 and filter the digital signal 102, to generate a first filtered signal 611, a second filtered signal 621, a third filtered signal 631 and a fourth filtered signal 641, respectively.

The minimal-difference determining unit 70 can calculate a plurality of signal difference values between the digital signal 102 and the first filtered signal 611, the second filtered signal 621, between the third filtered signal 631 and the fourth filtered signal 641, and output the minimal signal difference value 701 among the plurality of signal difference values, and also output a filtered signal 702 corresponding to the minimal signal difference value 701. For example, when the signal difference value between the digital signal 102 and first filtered signal 611 is the minimal value among the plurality of signal difference values, the minimal-difference determining unit 70 outputs the first filtered signal 611 as the filtered signal 702.

The determining unit 43 can compare the minimal signal difference value 701 with the preset threshold value 431 to generate the comparison result, and then generate the selection signal 432 according to the comparison result. The selecting unit 50 can receive the digital signal 102 and the filtered signal 201, and output one of the digital signal 102 and the filtered signal 702 according to the selection signal 411. When the minimal signal difference value 701 is higher than the preset threshold value 431, the selecting unit 50 outputs the digital signal 102, and when the minimal signal difference value 701 is lower than or equal to the preset threshold value 431, the selecting unit 50 can output the filtered signal 702.

The difference between the embodiment shown in FIG. 7 and aforementioned embodiments is that the embodiments shown in FIG. 7 uses a plurality of filters, so that it is not necessary to use the adjustable filter and the feedback scheme to adjust the filter bandwidth.

Figure 8:
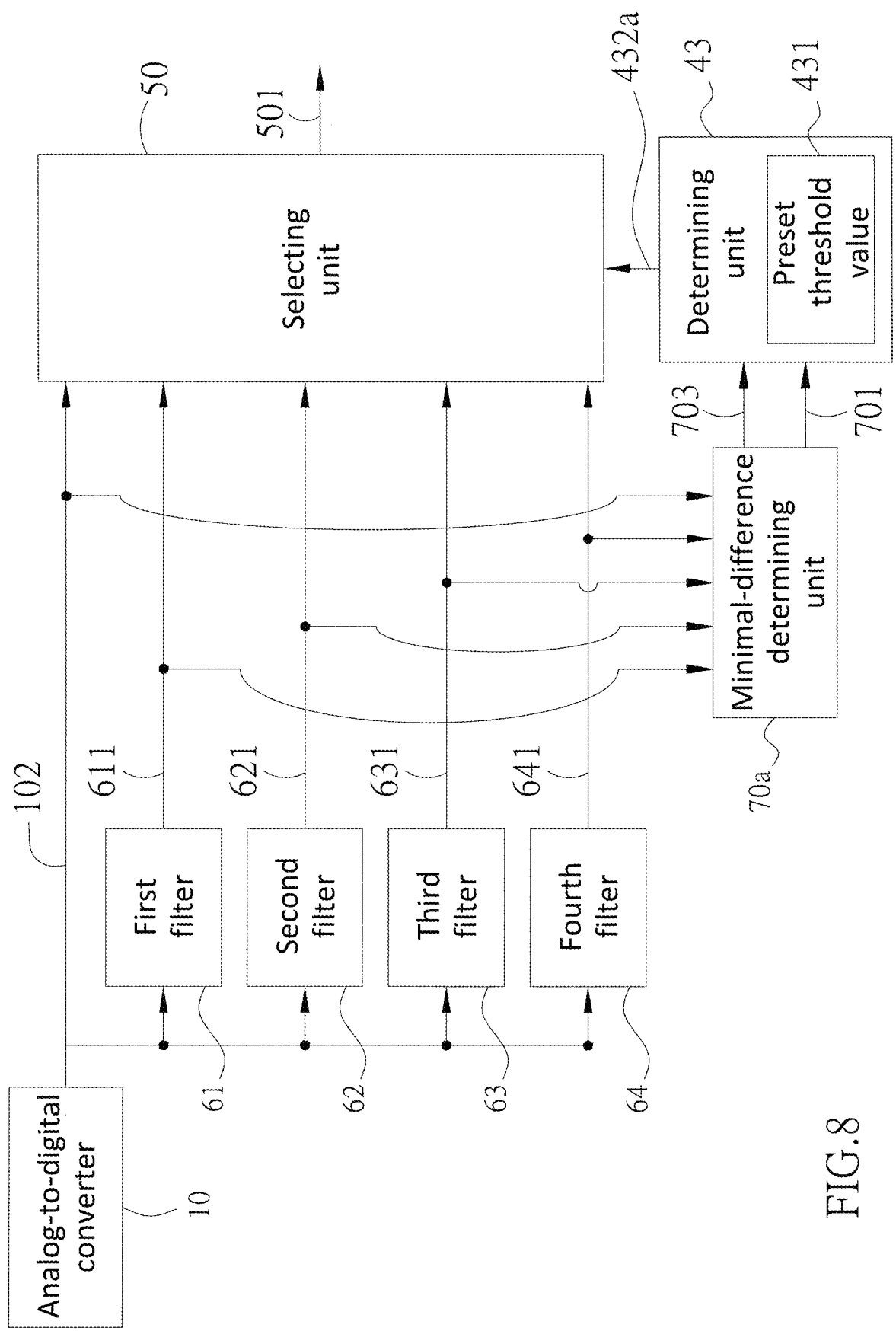
FIG. 8 is a block diagram of another embodiment of a signal processing system of the present invention.

Please refer to FIG. 8, which is a block diagram of another embodiment of a signal processing system of the present invention. As shown in FIG. 8, the signal processing system can be adapted to the analog-to-digital converter, and the signal processing system can comprise the first filter 61, the second filter 62, the third filter 63, the fourth filter 64, a minimal-difference determining unit 70a, the determining unit 43 and the selecting unit 50. The first filter 61, the second filter 62, the third filter 63, the fourth filter 64 have different bandwidths.

The first filter 61, the second filter 62, the third filter 63, the fourth filter 64 and receive the digital signal 102 outputted from the analog-to-digital converter 10, and filter the digital signal 102 to generate the first filtered signal 611, the second filtered signal 621, the third filtered signal 631 and the fourth filtered signal 641, respectively.

The minimal-difference determining unit 70a can calculate the plurality of signal difference values between the digital signal 102 and the first filtered signal 611, the second filtered signal 621, the third filtered signal 631 and the fourth filtered signal 641, and output the minimal signal difference value 701 among the plurality of signal difference values, and output a filter ID code 703 corresponding to the minimal signal difference value 701. For example, when the signal difference value between the and the digital signal 102 and first filtered signal 611 is the minimal value among the plurality of signal difference values, the minimal-difference determining unit 70a can output "1" as the filter ID code 703.

The determining unit 43 can compare the minimal signal difference value 701 with the preset threshold value 431 to generate the comparison result, and then generate the selection signal 411 according to the comparison result and the filter ID code 703. The selecting unit 50 can receive the digital signal 102, the first filtered signal 611, the second filtered signal 621, the third filtered signal 631 and the fourth filtered signal 641, and output one of the digital signal 102, the first filtered signal 611, the second filtered signal 621, the third filtered signal 631, and the fourth filtered signal 641 according to the selection signal 411.

When the minimal signal difference value 701 is higher than the preset threshold value 431, the selection signal 432 outputted from the determining unit 43 is "0", and the selecting unit 50 output the digital signal 102; when the minimal signal difference value 701 is lower than or equal to the preset threshold value 431, the determining unit 43 outputs the filter ID code 703 as the selection signal 432, so that the selecting unit 50 outputs one of the first filtered signal 611, the second filtered signal 621, the third filtered signal 631, and the fourth filtered signal 641.

The present invention disclosed herein has been described by means of specific embodiments. However, numerous modifications, variations and enhancements can be made thereto by those skilled in the art without departing from the spirit and scope of the present invention set forth in the claims.

What is claimed is:

1. A signal processing system, adapted to an analog-to-digital converter, and the signal processing system comprising:
  an adjustable filter configured to receive a digital signal outputted from the analog-to-digital converter, and filter the digital signal to generate a filtered signal;
  a signal difference calculating unit configured to calculate and output a signal difference value between the digital signal and the filtered signal;
  a determining unit configured to compare the signal difference value with a preset threshold value to generate a comparison result, and generate a selection signal and a bandwidth adjustment signal according to the comparison result; and
  a selecting unit configured to receive the digital signal and the filtered signal, and output one of the digital signal and the filtered signal according to the selection signal;
  wherein a bandwidth of the adjustable filter is adjusted according to the bandwidth adjustment signal.

2. The signal processing system according to claim 1, wherein the adjustable filter is an adjustable low-pass filter.

3. The signal processing system according to claim 1, wherein when the signal difference value is higher than the preset threshold value, the selecting unit outputs the digital signal according to the selection signal, and the adjustable filter extends the bandwidth thereof according to the bandwidth adjustment signal; and
  wherein when the signal difference value is lower than the preset threshold value, the selecting unit outputs the filtered signal according to the selection signal, and the adjustable filter narrows the bandwidth thereof according to the bandwidth adjustment signal.

4. The signal processing system according to claim 1, wherein the preset threshold value comprises a first threshold value and a second threshold value, the determining unit compares the signal difference value with the first threshold value and the second threshold value, respectively, to generate the comparison result and generates the selection signal and the bandwidth adjustment signal according to the comparison result, wherein the first threshold value is higher than the second threshold value; and
  wherein when the signal difference value is higher than the first threshold value, the selecting unit outputs the digital signal according to the selection signal, and the adjustable filter extends the bandwidth thereof according to the bandwidth adjustment signal, and when the signal difference value is lower than the first threshold value and higher than the second threshold value, the selecting unit outputs the filtered signal according to the selection signal, and the adjustable filter narrows the bandwidth thereof according to the bandwidth adjustment signal, and when the signal difference value is lower than the second threshold value, the selecting unit outputs the filtered signal according to the selection signal, and the adjustable filter keeps the bandwidth thereof.

5. The signal processing system according to claim 1, wherein the adjustable filter comprises a first adjustable filter and a second adjustable filter configured to filter the digital signal to generate a first filtered signal and a second filtered signal, respectively, and a bandwidth of the first adjustable filter is broader than a bandwidth of the second adjustable filter; and wherein the signal difference calculating unit calculates and outputs a first signal difference value and a second signal difference value between the digital signal and the first filtered signal and the second filtered signal, respectively, and the determining unit compares the first signal difference value and the second signal difference value with a preset threshold value to generate the comparison result, and generate the selection signal, a first bandwidth adjustment signal and a second bandwidth adjustment signal according to the comparison result.

6. The signal processing system according to claim 5, wherein when the first signal difference value and the second signal difference value are higher than the preset threshold value, the selecting unit outputs the digital signal according to the selection signal, and the first adjustable filter extends the bandwidth according to the first bandwidth adjustment signal;

wherein when the first signal difference value is lower than the preset threshold value and the second signal difference value is higher than the preset threshold value, the selecting unit outputs the first filtered signal according to the selection signal, and the first adjustable filter narrows the bandwidth according to the first bandwidth adjustment signal, and the second adjustable filter extends the bandwidth according to the second bandwidth adjustment signal; and wherein when both of the first signal difference value and the second signal difference value are lower than the preset threshold value, the selecting unit outputs the second filtered signal according to the selection signal, and the second adjustable filter narrows the bandwidth thereof according to the second bandwidth adjustment signal.

7. The signal processing system according to claim 6, wherein the preset threshold value comprises a first threshold value and a second threshold value, the determining unit compares the first signal difference value and the second signal difference value with the first threshold value and the second threshold value, and the first threshold value is higher than the second threshold value;

wherein when both of the first signal difference value and the second signal difference value are higher than the first threshold value, the selecting unit outputs the digital signal according to the selection signal, and the first adjustable filter extends the bandwidth thereof according to the first bandwidth adjustment signal;

wherein when both of the first signal difference value and the second signal difference value are lower than the first threshold value, the selecting unit outputs the second filtered signal according to the selection signal, and the second adjustable filter narrows the bandwidth thereof according to the second bandwidth adjustment signal;

wherein when the first signal difference value is lower than the first threshold value and higher than the second threshold value and the second signal difference value is higher than the first threshold value, the selecting unit outputs the first filtered signal according to the selection signal, and the first adjustable filter narrows the bandwidth thereof according to the first bandwidth adjustment signal, and the second adjustable filter extends the bandwidth thereof according to the second bandwidth adjustment signal;

wherein when the first signal difference value is lower than the second threshold value, the selecting units output the first filtered signal according to the selection signal, and the first adjustable filter keeps the bandwidth thereof; and wherein when the second signal difference value is lower than the second threshold value, the selecting unit outputs the second filtered signal according to the selection signal, and the second adjustable filter keeps the bandwidth thereof.

8. A signal processing method, adapted to an analog-to-digital converter outputting a digital signal, the signal processing method comprising:

using an adjustable filter to filter the digital signal, to generate a filtered signal;

calculating and outputting a signal difference value between the digital signal and the filtered signal;

comparing the signal difference value with a preset threshold value, to generate a comparison result, and then generating a selection signal and a bandwidth adjustment signal according to the comparison result;

according to the selection signal, outputting one of the digital signal and the filtered signal; and adjusting a bandwidth of the adjustable filter according to the bandwidth adjustment signal.

9. A signal processing system, adapted to an analog-to-digital converter, the signal processing system comprising:

a plurality of filters configured to receive a digital signal outputted from the analog-to-digital converter, and filter the digital signal to generate a plurality of filtered signals, wherein the plurality of filters have different bandwidths;

a signal difference calculating unit configured to calculate and output a plurality of signal difference values between the digital signal and the plurality of filtered signals, and output a minimal signal difference value among the plurality of signal difference values, and output the filtered signal corresponding to the minimal signal difference value;

a determining unit configured to compare the minimal signal difference value with a preset threshold value to generate a comparison result, and then generate a selection signal according to the comparison result; and a selecting unit configured to receive the digital signal and the filtered signal corresponding to the minimal signal difference value, and output one of the digital signal and the filtered signal corresponding to the minimal signal difference value, according to the selection signal.

10. A signal processing system, adapted to an analog-to-digital converter, the signal processing system comprising:

a plurality of filters configured to receive a digital signal outputted from the analog-to-digital converter, and filter the digital signal to generate a plurality of filtered signals, wherein the plurality of filters have different bandwidths;

a signal difference calculating unit configured to calculate and output a plurality of signal difference values between the digital signal and the plurality of filtered signals, and output a minimal signal difference value among the plurality of signal difference values, and a filter ID code corresponding to the minimal signal difference value;

a determining unit configured to compare the minimal signal difference value with a preset threshold value to generate a comparison result, and then generate a selection signal according to the comparison result and the filter ID code; and
a selecting unit configured to receive the digital signal and the filtered signal, and output one of the digital signal and the plurality of filtered signals according to the selection signal.

* * * * *